(12) United States Patent
Chen

(10) Patent No.: US 7,459,351 B2
(45) Date of Patent: Dec. 2, 2008

(54) METHOD OF MANUFACTURING AN AMOLED

(75) Inventor: Chen-Ming Chen, Tai-Chung (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 315 days.

(21) Appl. No.: 11/161,786

(22) Filed: Aug. 16, 2005

(65) Prior Publication Data

US 2007/0042518 A1    Feb. 22, 2007

(51) Int. Cl.
    H01L 21/00    (2006.01)
    H01L 29/04    (2006.01)
    H01L 29/10    (2006.01)
    H01L 31/00    (2006.01)

(52) U.S. Cl. .......................................... 438/149; 257/59

(58) Field of Classification Search .................. 257/100
    See application file for complete search history.

(56) References Cited

U.S. PATENT DOCUMENTS

| 2001/0055828 | A1 | 12/2001 | Kaneko et al. |
| 2003/0127650 | A1 | 7/2003 | Park |
| 2004/0079945 | A1 | 4/2004 | Weaver et al. |
| 2004/0191566 | A1 | 9/2004 | Kikuchi et al. |
| 2004/0235224 | A1* | 11/2004 | Lin et al. ..................... 438/149 |
| 2004/0256979 | A1 | 12/2004 | Murakami |
| 2005/0095761 | A1 | 5/2005 | Tanaka |
| 2006/0001091 | A1* | 1/2006 | Kim ........................... 257/347 |
| 2006/0043373 | A1 | 3/2006 | Wu et al. |
| 2006/0146217 | A1* | 7/2006 | Ahn et al. ..................... 349/43 |
| 2007/0029545 | A1 | 2/2007 | Striakhilev et al. |

FOREIGN PATENT DOCUMENTS

| CN | 1353328 A | 6/2002 |
| CN | 1561150 A | 1/2005 |
| CN | 1897299 A | 1/2007 |
| JP | H8-241998 | 9/1996 |
| JP | 2001-290439 | 10/2001 |
| JP | 2004-220870 | 8/2004 |
| JP | 2005-148728 | 6/2005 |
| TW | 1238020 | 8/2005 |

* cited by examiner

*Primary Examiner*—Ha Tran T Nguyen
*Assistant Examiner*—Valerie Brown
(74) *Attorney, Agent, or Firm*—Winston Hsu

(57) ABSTRACT

The present invention relates to a method of manufacturing an AMOLED panel. The method comprises providing a substrate, forming a data line and a drain metal on the substrate, forming a buffer insulator layer, forming an active layer, forming a gate insulator layer, forming a gate metal, performing an ion doping to form a source and a drain, forming a via hole, forming a transparent electrode and a pixel define layer, and forming a LED on the transparent electrode.

10 Claims, 8 Drawing Sheets

METHOD OF MANUFACTURING AN AMOLED

BACKGROUND OF THE INVENTION

1. Field of the Invention

A method of manufacturing a TFT panel, and more particularly, to a method of manufacturing a LTPS TFT OLED panel.

2. Description of the Prior Art

In general, low temperature poly crystalline silicon thin film transistor (LTPS TFT) array manufacturing needs about six to nine photo-masks to process a photolithograph etching process (PEP), which is more complex than five photo-masks required to manufacture the hydrogenated amorphous silicon thin film transistor (α-Si:H TFT). In addition, the active matrix organic light-emitting diode (AMOLED) needs seven to ten photo-masks, because of the need to manufacture an LTPS TFT array and a pixel define layer (PDL).

Please refer to FIG. 1. FIG. 1 is schematic diagram of a traditional OLED TFT structure 100. In the prior art, a glass substructure 102 is provided, with an insulator layer 104 and amorphous silicon film (not shown) doped on the glass substructure 102. The amorphous silicon film then re-crystallizes to polycrystalline silicon after an excimer laser annealing (ELA) process. Then, an active layer 106 pattern is etched on the polycrystalline silicon by a first PEP with a first mask, and a gate insulator layer 108 is deposited on the active layer 106 and the insulator layer 104.

Moreover, a gate metal 110 is etched by a metal etching process, a second mask, and a second PEP. The gate metal 110 is a self-alignment mask and the boron ion doping process proceeds on the active layer 106, forming a source 103 and a drain 105 on the corresponding sides of the gate metal 110. In the prior art, a capacitance (Cst) 113 is formed on a poly silicon lower panel 107, the gate insulator layer 108 and a gate metal upper panel 111 by the above-mentioned first PEP and the second PEP individually. Then, an inter-layer dielectric (ILD) 112 is doped on the glass substructure 102 to cover the gate metal 110, the gate metal upper panel 111, and the gate insulator layer 108. The particle ILD and the gate insulator layer 108 of the source 103 and the drain 105 are then removed by a third photo-mask and a third PEP to define a corresponding via hole 115. Furthermore, a metal etching process is performed utilizing a fourth photo-mask, and the fourth mask etches a data line and a drain metal on the via hole 115 of metal layer 114 for electrically contacting the source 103 and the drain 105. A flat passivation layer 116 is doped on the metal layer 114 and the ILD 112 using a fifth photo-mask and a fifth PEP, and the passivation layer 116 on the metal layer 114 which electrically contacts the drain 105 is removed. An ITO transparent electrode film (not shown) is formed on the passivation layer 116, and a sixth photo-mask and a sixth PEP are used to define the suitable shape of the transparent electrode 118. Then, a pixel define layer (PDL) 120 is processed and is etched by a seven photo-mask and a seven PEP. Finally, a LED (not shown) is formed on the transparent electrode 118 to complete the traditional OLED panel 110.

In the prior art, seven photo-masks are needed to complete the above-mentioned OLED. The process is complex and the use of too many masks increases the cost and increases the misalignment, thereby decreasing the yield. That is why decreasing the number of the photo-masks is an important issue in the monitor manufacturing industry.

SUMMARY OF THE INVENTION

The present invention relates to a method of manufacturing an AMOLED to solve the above-mentioned problems.

The present invention provides an embodiment relating to a method of manufacturing an AMOLED panel. The method comprises providing a substrate, forming a data line and a drain metal on the substrate, forming a buffer insulator layer, forming an active layer, forming a gate insulator layer, forming a gate metal, performing an ion doping to form a source and a drain, forming a via hole, forming a transparent electrode and a pixel define layer, and forming a LED on the transparent electrode.

The present invention changes the metal line position in the LTPS TFT array LED, the gate metal is on the metal layer, the ILD of the prior art is omitted, and the buffer insulator layer and the gate insulator are the insulator layer between the metal layer and the gate metal to avoid shorting. Furthermore, the present invention omits the passivation layer, needs only six photo-masks, decreases the manufacturing cost and simplifies the manufacturing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
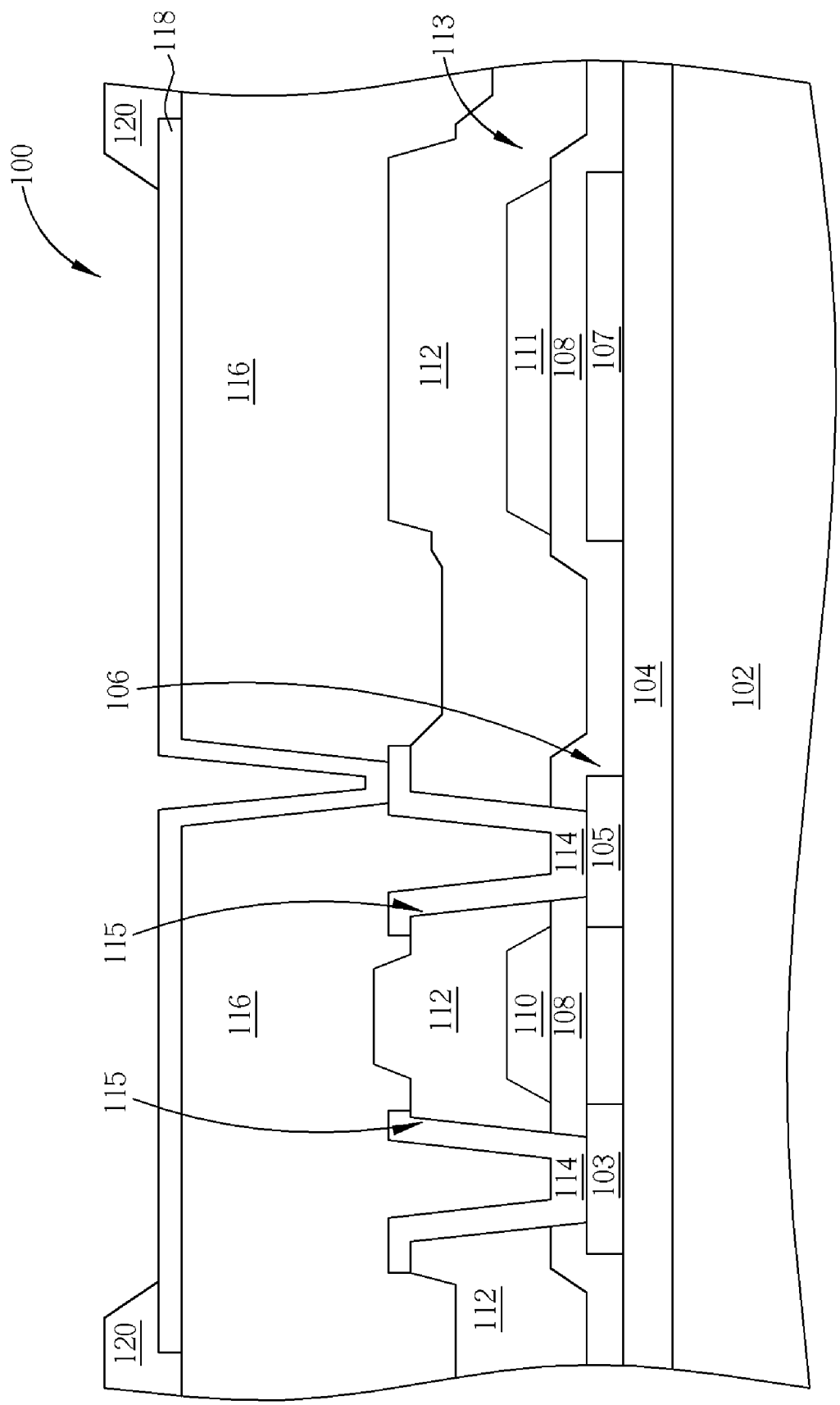
FIG. 1 is schematic diagram of a traditional OLED TFT structure.
Figure 2:
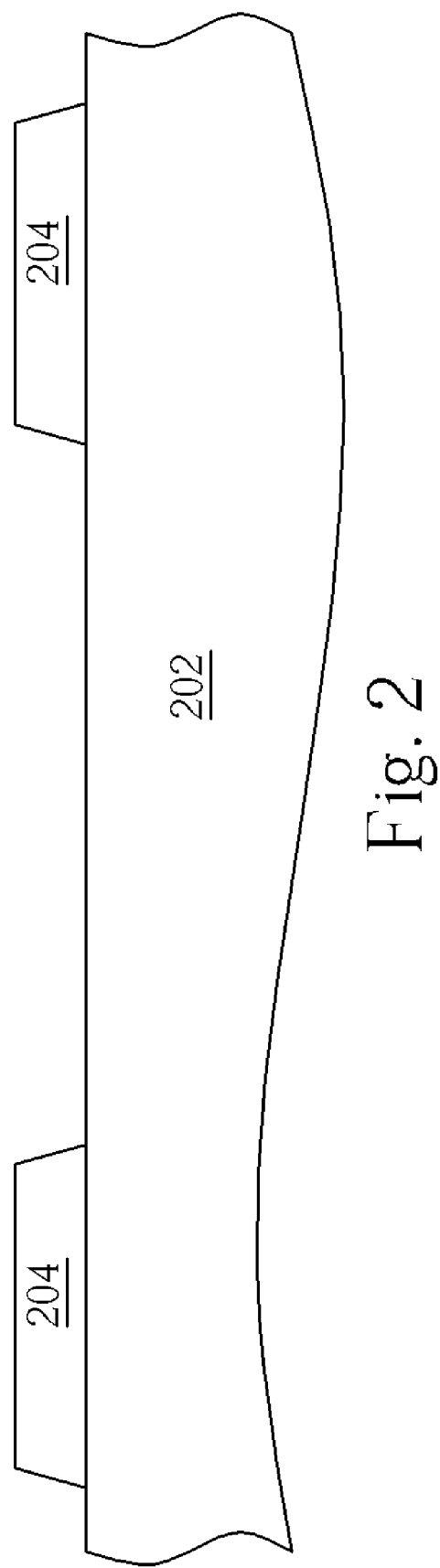
FIGS. 2 to 8 are schematic diagrams of manufacturing an AMOLED panel.

Please refer to FIGS. 2 to 8. FIGS. 2 to 8 are schematic diagrams of manufacturing an AMOLED panel. As FIG. 2 shows, firstly, a glass substrate 202 is provided as a lower base, a first metal film (not shown) is formed on the glass substrate 202, and then a first photo-mask is used to perform a first PEP on the first metal film to form a data line, drain 204, etc. A substrate may include a transparent glass substrate, a pure substrate, a flexible plastic substrate and a metal foil, which can be used in lieu of the glass substrate 202 shown in FIGS. 2-8.

Figure 3:
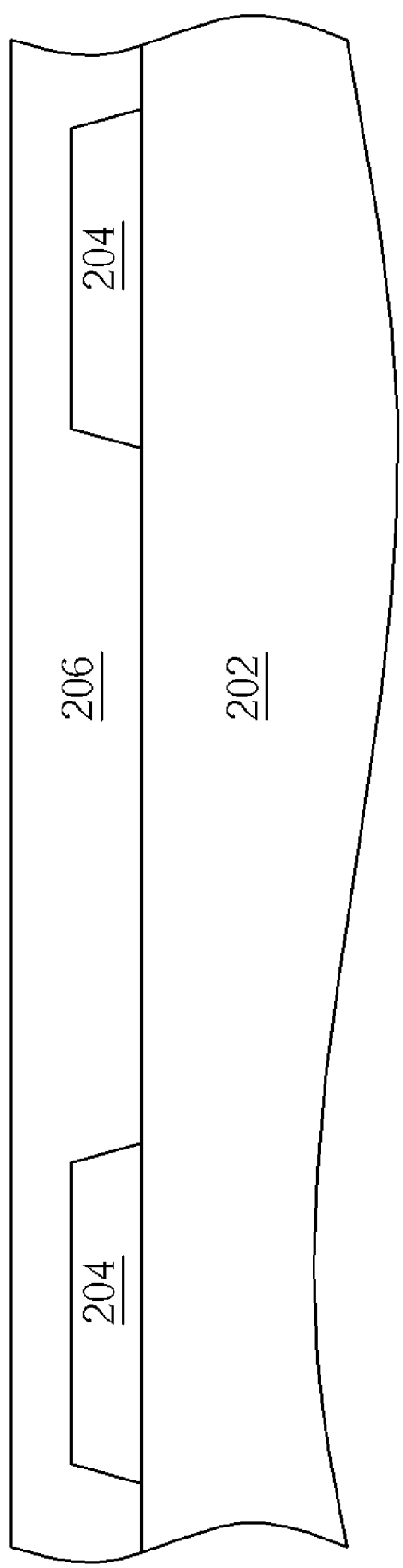
Figure 4:
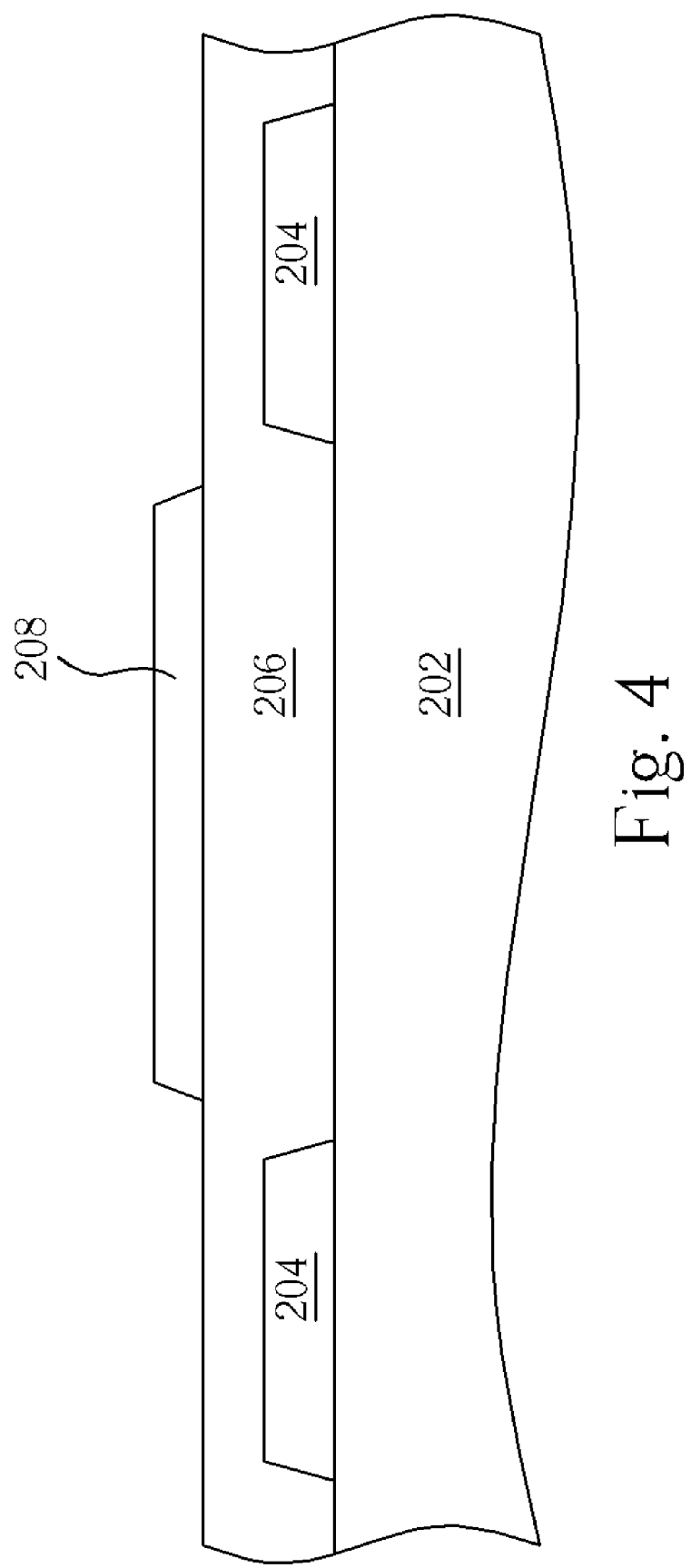

As FIG. 3 shows, a buffer insulator layer 206 is formed on the metal layer 204. Next, an anamorphous silicon film (not shown) is formed on the buffer insulator layer 206, and an excimer laser annealing process is performed on the anamorphous silicon film to produce a polycrystalline silicon. Then, a second photo-mask is used and a second PEP is performed on the polycrystalline silicon (not shown) to form an active layer 208 pattern. The active layer 208 is formed on the buffer insulator layer 206, which is over the data line and the drain, as FIG. 4 shows.

Figure 5:
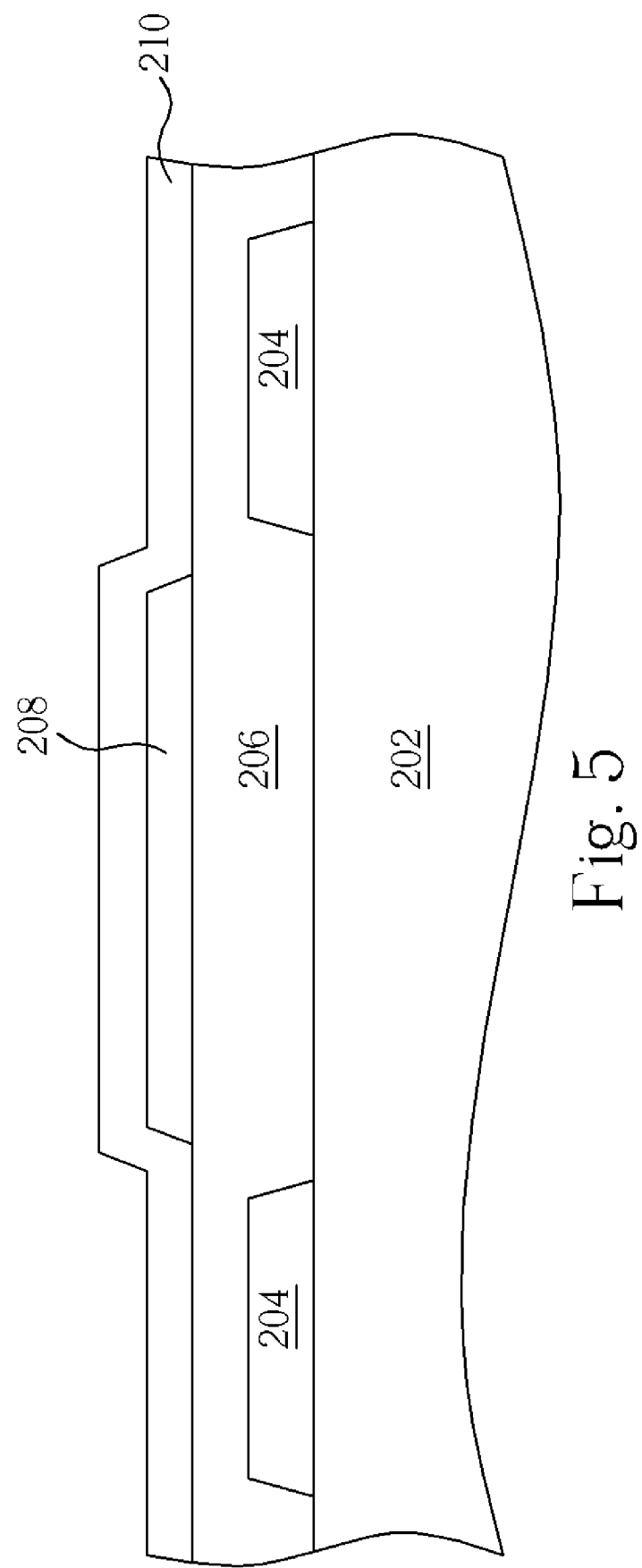
Figure 6:
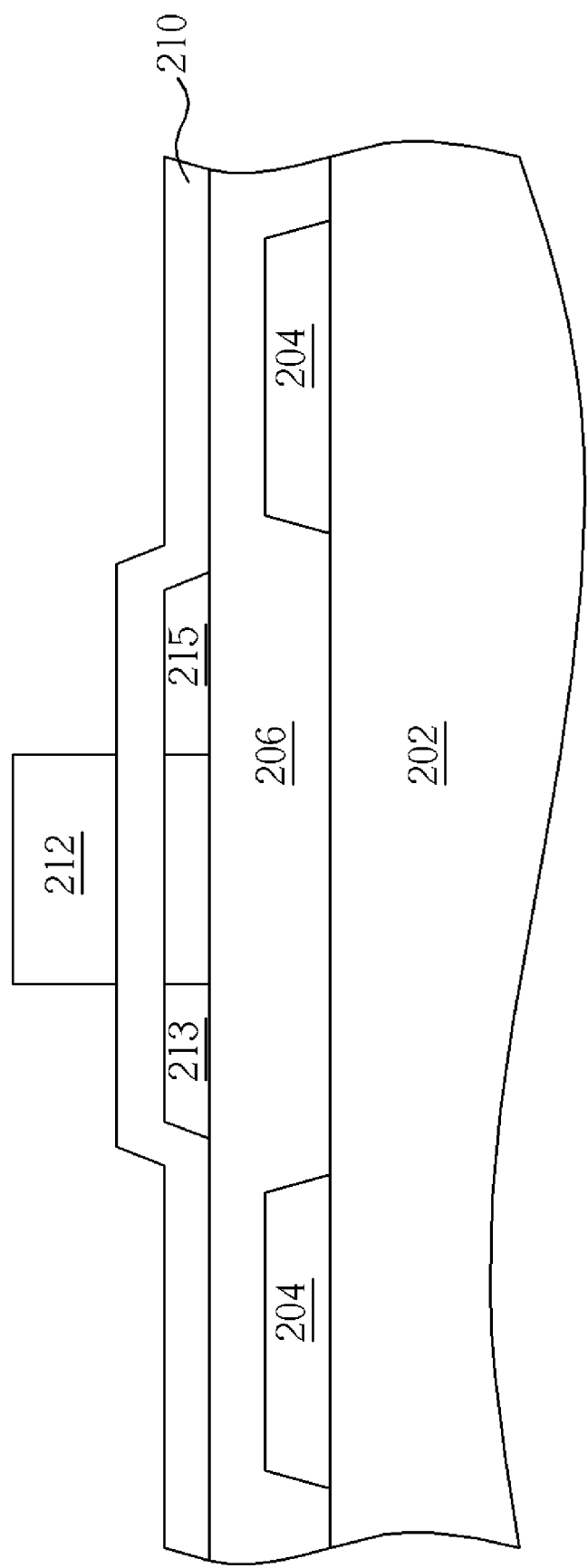

Please refer to FIG. 5, which shows a gate insulator layer 210 formed on the active layer 208 and the buffer insulator layer 206 surface. Then, a second metal film is performed to form a second metal film (not shown) on the gate insulator layer 210, and a third photo-mask and a third PEP are used to form a gate metal 212 as FIG. 6 shows. The gate metal 212 is then used as a self-alignment mask. A boron ion doping is performed on the active layer 208, and forms a source 213 and a drain 215 on the corresponding sides of the active layer 208. Please notice that in the present invention, the gate metal 212 is on the metal layer 204, but the metal layer 114 is on the gate metal 110 in the prior art. Thus, the present invention changes the metal position in the MOS.

Figure 7:
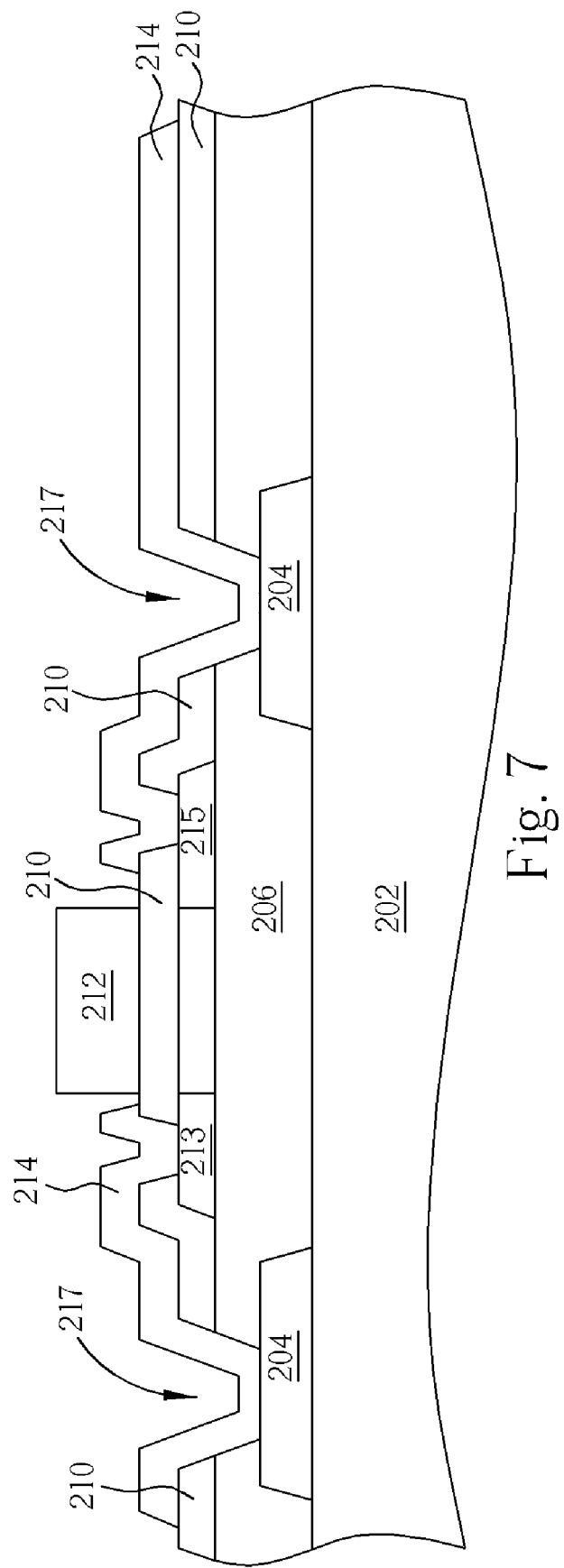

Please refer to FIG. 7, which uses a fourth photo-mask and a fourth PEP to etch the gate insulator layer 210 and the buffer insulator layer 206 and forms a via hole 217 the via hole 217 reaching the source 213, drain 215 and the metal layer 204. Then, an ITO or IZO is formed to be a transparent electrode film (not shown) on the gate metal 212, the metal layer 204, the source 213, the drain 215, and the gate insulator layer 210. A suitably shaped transparent electrode 214 is defined by a fifth photo-mask and a fifth PEP, the transparent electrode 214 electrically contacting with the metal layer 204 of the data line, the source 213, the metal layer 204 as the drain and the drain 215. If one or more transparent electrode is formed, a plurality of transparent electrodes may be formed on each via hole and the gate insulator layer surface.

Figure 8:
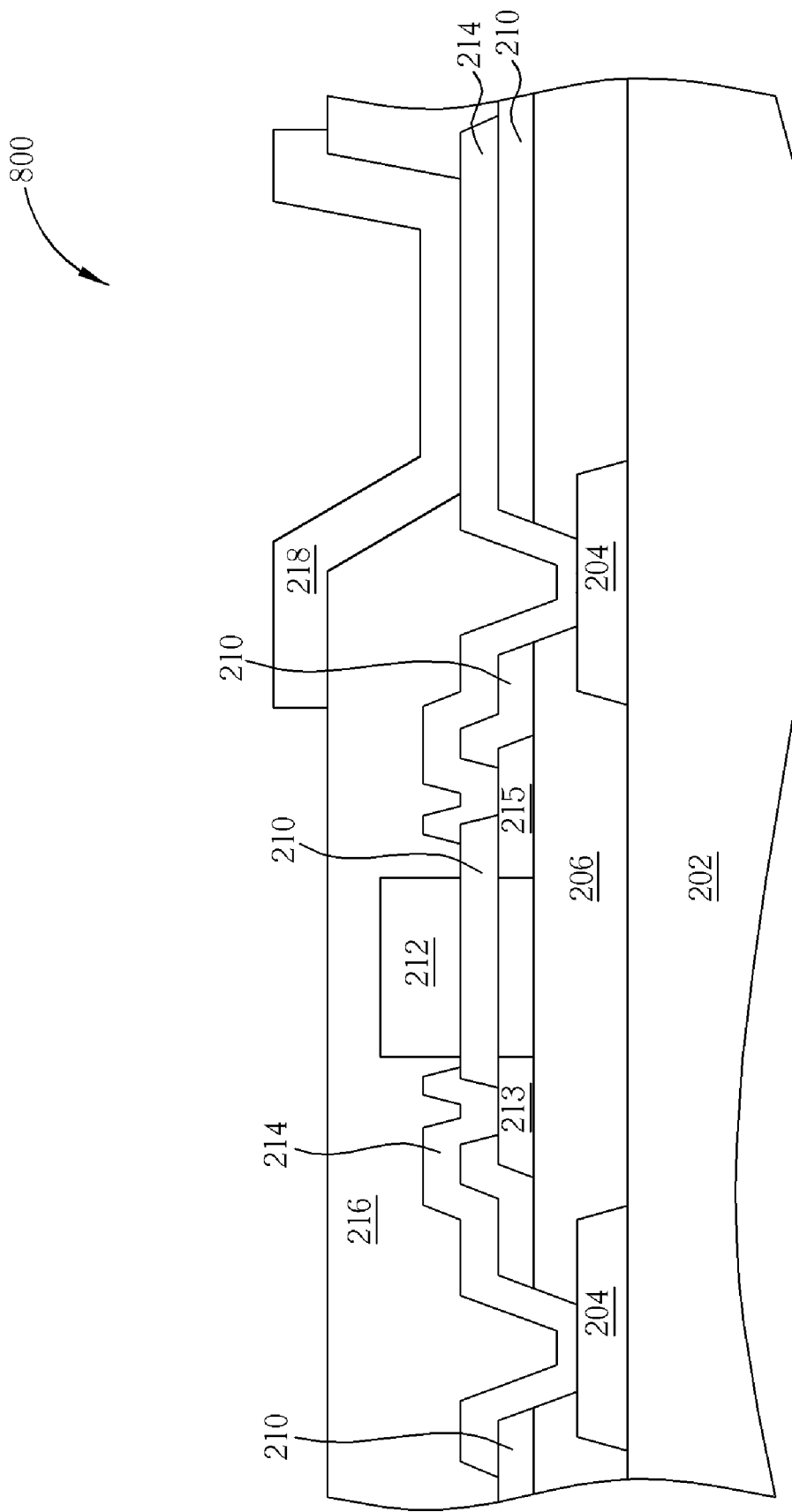

Please refer to FIG. 8, which illustrates a spin on glass (SOG) process using silica or photo sensitization material on the transparent electrode 214, the gate insulator layer 210 and the gate metal 212 to form a flat pixel define layer (PDL) 216. The PDL 216 is etched by a sixth photo-mask and a sixth PEP to expose the transparent electrode 214 electrically contacting with the drain 215. Finally, an organic LED 218 is formed on the exposed transparent electrode 214, and the present invention OLED panel 800 is completed. Please note the shape of the transparent electrode 214. When the shape of the transparent electrode 214 is wider than the metal layer 204 electrically contacting with the drain 215, the OLED 218 light will emit from the up and down directions, and will form a bottom emission LED panel or a top and bottom LED panel.

Compared to the prior art, the present invention changes the metal line position in the LTPS TFT array LED, the gate metal is on the metal layer, the ILD of the prior art is omitted, the buffer insulator layer and the gate insulator are the insulator layer between the metal layer and the gate metal to avoid shorting. Furthermore, in the present invention, the PDL is made by the SOG process to form a flat structure. Besides, the present invention omits the passivation layer, needs only six photo-masks, decreases the manufacturing cost and simplifies the manufacturing process. Furthermore, the present invention can not only be applied to the LTPS TFT array LCD panel, but also needs only six masks. The present invention could form a reflective transmissive or half-reflective-half-transmissive LCD by adjusting the different corresponding position of the metal layer and the transparent electrode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an active matrix organic light-emitting diode (AMOLED), the method comprising:
    providing a substrate;
    forming at least a data line and at least a drain metal on the substrate;
    forming a buffer insulator layer on the substrate, the data line and the drain metal;
    forming at least an active layer on the buffer insulator layer;
    forming a gate insulator layer on the active layer and the buffer insulator layer;
    forming a gate metal on the gate insulator layer above the active layer;
    using the gate metal as a self-alignment mask and doping an ion on the active layer to form a source and a drain on the corresponding sides of the gate metal;
    forming a plurality of via holes on the gate insulator layer that reach the data line, the drain metal, the drain and the source surface;
    forming a plurality of transparent electrodes on each via hole and the gate insulator layer surface, each transparent electrode electrically contacting with the data line, the drain, and the drain metal;
    forming a pixel define layer on the transparent electrode, the gate metal, and the gate insulator layer to expose the transparent electrode; and
    forming a light-emitting diode on the transparent electrode.

2. The method of claim 1, wherein the substrate is selected from a group consisting of a transparent glass substrate, a pure substrate, a flexible plastic substrate, and a metal foil.

3. The method of claim 1, wherein the method of forming the data line and the drain metal further comprises:
    forming a first metal film on the substrate surface; and
    performing a first PEP on the first metal film to form the data line and the drain metal.

4. The method of claim 1, wherein the method of forming the active layer further comprises:
    forming an amorphous silicon film on the buffer insulator layer surface;
    re-crystallizing the amorphous silicon film, the amorphous silicon film becoming a poly silicon film; and
    performing a second PEP on the poly silicon film to form the active layer.

5. The method of claim 1, wherein the method of forming the gate metal further comprises:
    forming a second metal film on the gate insulator layer surface; and
    performing a third PEP on the second metal film to form the gate metal.

6. The method of claim 1, wherein the via holes in the gate insulator layer are made by a fourth PEP.

7. The method of claim 1, wherein the method of forming the transparent electrode and the pixel define layer further comprises:
    forming a transparent electrode film on the gate insulator layer and the gate metal surface;
    performing a fifth PEP on the transparent electrode film to form the transparent electrode; and
    using a depositing process and a sixth PEP to form the pixel define layer.

8. The method of claim 7, wherein the electric connect transparent electrode cover is wider than the drain metal, the AMOLED is a bottom emission LED panel and an upper-lower light emitting OLED panel.

9. The method of claim 7, wherein the transparent electrode is ITO or IZO.

10. The method of claim 1, wherein the pixel define layer is made by a spin on glass process.

* * * * *